United States Patent [19]
Kishimoto et al.

[11] 4,396,851
[45] Aug. 2, 1983

[54] SURFACE ACOUSTIC WAVE DEVICE

[75] Inventors: Kiyoharu Kishimoto; Hitoshi Yanagihara, both of Yokohama; Katashi Hazama, Zushi, all of Japan

[73] Assignee: Hitachi, Ltd., Tokyo, Japan

[21] Appl. No.: 211,905

[22] Filed: Dec. 1, 1980

[30] Foreign Application Priority Data

Nov. 30, 1979 [JP] Japan ................................ 54-154390

[51] Int. Cl.³ ............................................ H01L 41/00
[52] U.S. Cl. ............................ 310/313 B; 310/313 R; 333/194
[58] Field of Search ........... 310/313 R, 313 B, 313 C, 310/322; 333/151, 154, 194

[56] References Cited

U.S. PATENT DOCUMENTS 4,035,675 7/1977 Malocha et al. ................ 310/313 B

OTHER PUBLICATIONS

E. L. Walker, "Designing Surface Acoustic Wave Filters", IBM Technical Disclosure Bulletin, vol. 19, No. 9, Feb. 1977, pp. 3526-3528.

Primary Examiner—William M. Shoop
Assistant Examiner—Peter S. Wong
Attorney, Agent, or Firm—Antonelli, Terry & Wands

[57] ABSTRACT

A surface acoustic wave device is provided with plural sets of input and output transducers arranged on a piezoelectric substrate with the input transducers and the output transducers being connected electrically in parallel, respectively. In order to minimize a loss which occurs due to the parallel connections of the input and output transducers, aperture dimensions of either the input transducers or the output transducers are selected such that static capacitances of the respective transducers are equal.

4 Claims, 5 Drawing Figures

SURFACE ACOUSTIC WAVE DEVICE

BACKGROUND OF THE INVENTION

1. Field of the Invention

The present invention relates to a surface acoustic wave device having plural sets of parallel-connected input and output transducers arranged on a piezoelectric substrate such that a loss is minimized.

2. Description of the Prior Art

A conventional device of this type, as shown in FIG. 1 has parallel-connected input interdigital transducers 2a and 2b and parallel-connected output interdigital transducers 3a and 3b arranged on a piezoelectric substrate 1 with the input transducers 2a and 2b being connected in parallel by common bus bars 4 and 5 and to an input signal line 6 and the output electrodes 3a and 3b being connected in parallel by common bus bars 7 and 8 and to an output signal line 9 from which an output signal is taken. Numeral 10 denotes an acoustic wave absorber. The plurality of input and output transducers are arranged to allow the coverage of a wide band by selecting different operating frequency bands of the respective transducers. The common connections by the bus bars allow the size reduction of the entire device.

In the surface acoustic wave device having the parallel-connected input and output transducers as shown in FIG. 1, the plurality (two in the illustrated example) of input and output transducers are respectively designed to present optimum frequency characteristics. Accordingly, when an electric signal is applied to the input signal line 6, a characteristic in a certain frequency band is affected by impedances of other transducers which contribute to other frequency bands so that a loss tends to increase. For example, in a transducer structure shown below, the loss of the transducer set 2a and 3a increases by approximately 1.5 dB by the parallel connection while the loss of the transducer set 2b and 3b increases by approximately 7.0 dB by the parallel connection.

| Transducer | Number of Electrodes | Center Frequency (MHz) | Aperture dimension (Microns) | Static capacitance (pF) |
|---|---|---|---|---|
| 2a | 123 | Weighted | $W_1 = 600$ | 2.8 |
| 3a | 14 | 602 | $W_2 = 600$ | 1.7 |
| 2b | 10 | 752 | $W_3 = 600$ | 1.2 |
| 3b | 10 | 752 | $W_4 = 600$ | 1.2 |

SUMMARY OF THE INVENTION

It is an object of the present invention to provide a surface acoustic wave device having plural sets of input and output transducers each connected in parallel, in which a loss due to the parallel connections of the respective sets of input and output transducers is minimized without changing characteristics.

In order to attain the above object, the present invention provides a surface acoustic wave device having plural sets of parallel-connected input and output transducers in which static capacitances of at least one of input and output transducers are equal from set to set so that the loss due to the parallel connections of the plural sets of input and output transducers is minimized.

DESCRIPTION OF THE PREFERRED EMBODIMENTS

Figure 2:
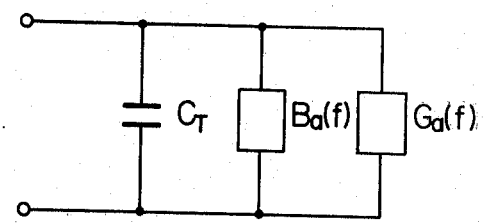
FIG. 2 shows an equivalent circuit diagram of a transducer of a surface acoustic wave device.

For the better understanding of the present invention, a principle of the present invention will be described with reference to FIGS. 2 and 3 prior to the description of the preferred embodiments of the present invention. Referring to FIG. 2, an equivalent circuit of an electrode of a surface acoustic wave device can be represented by a parallel connection of an equivalent conductance Ga(f), an equivalent suceptance Ba(f) and a static capacitance $C_T$. For a normal transducer having equally spaced electrodes, the equivalent conductance Ga(f), the equivalent suceptance Ba(f) and the static capacitance $C_T$ are given by the following formulas:

$$Ga(f) = 8 \, k^2 N f_o G \left( \frac{\sin x}{x} \right) \quad (1)$$

$$Ba(f) = 8 \, k^2 N f_o C_T \left( \frac{\sin 2x - 2x}{2x^2} \right)^2 \quad (2)$$

$$C_T = \epsilon_o \epsilon_s W N \quad (3)$$

where $k^2$ is an electromechanical coupling coefficient, N is the number of electrode pairs, fo is a center frequency, $\epsilon_s$ is a specific dielectric constant, $x = (f-f_o)/f_o$ and W is an aperture dimension of the transducer.

As seen from the formulas (1) and (2), the equivalent conductance Ga(f) and the equivalent suceptance Ba(f) directly relate to the frequency characteristic which is determined by the structures of the input and output transducers, but the static capacitance $C_T$ does not directly relate to the frequency characteristic as seen from the formula (3). Also, as seen from the formulas (1), (2) and (3), the static capacitance $C_T$ may be changed by changing the number of electrode pairs N or the aperture dimension W, but the change of the number of electrode pairs N causes a significant change in the frequency characteristic. On the other hand, the change of the aperture dimension W does not cause a change in the frequency characteristic and relates only to an overall output level.

Figure 3:
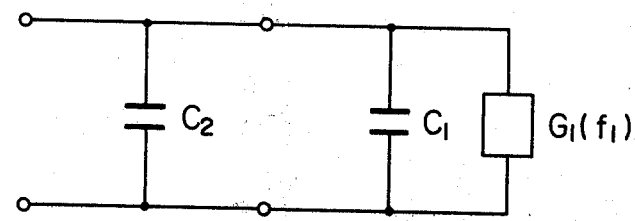
FIG. 3 shows an equivalent circuit diagram of parallel-connected transducers.

As an example, FIG. 3 shows an input or output equivalent circuit at a frequency $f_1$ for two sets of parallel-connected input and output transducers having center frequencies of $f_1$ and $f_2$. In FIG. 3, $G_1(f_1)$ is an equivalent conductance for the center frequency $f_1$ under consideration, $C_1$ is a static capacitance for $f_1$ and $C_2$ is a static capacitance for $f_2$. An equivalent suceptance for $f_1$ is omitted in FIG. 3 because Ba(f) is much smaller than Ga(f) when x reaches zero as seen from the formula (2). The equivalent conductance and the equivalent suceptance for $f_2$ are small enough to be neglected because they are out of band at the frequency $f_1$. A similar equivalent circuit can be represented for the frequency $f_2$. Accordingly, in order to minimize the loss due to the parallel connection of two sets of input and output transducers, a condition of $C_2 = C_1$ is to be satisfied for $C_1$ which is determined by the characteristic factors of the other. For a given number of electrode pairs N, the aperture dimension W is determined to present the same static capacitance $C_T$.

Figure 1:
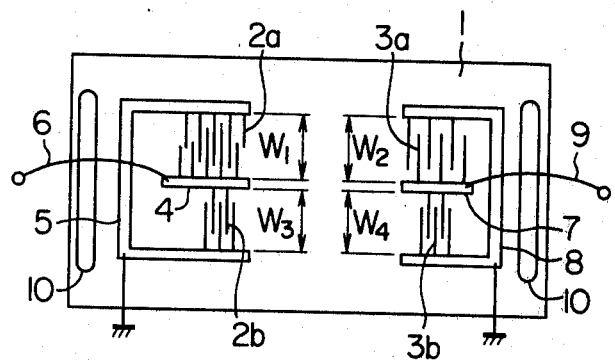
FIG. 1 is a plan view of a conventional surface acoustic wave device having two sets of input and output transducers.
Figure 4:
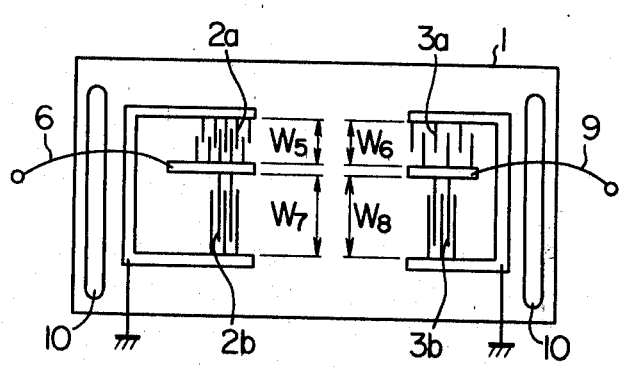
FIG. 4 shows a plan view of one embodiment of a surface acoustic wave device in accordance with the present invention.

Referring to FIG. 4, one embodiment of the present invention is now explained. The difference of the construction of the embodiment shown in FIG. 4 from that of FIG. 1 resides in that the aperture dimension $W_6$ and $W_8$ of the output electrodes 3a and 3b are selected to present equal static capacitances. The number of electrodes and the center frequencies are identical to those in FIG. 1. In the present embodiment, the aperture dimension are; $W_5 = W_6 = 530$ microns and $W_7 = W_8 = 730$ microns. Static capacitances of the electrodes 2a, 2b, 3a and 3b are 2.4 pF, 1.5 pF and 1.5 pF, respectively.

In the present embodiment, the increase of loss due to the parallel connection of the transducer set 2a, 3a is approximately 2.0 dB and that of the transducer set 2b, 3b is approximately 3.0 dB. To compare those with the losses of 1.5 dB and 7.0 dB in the conventional device, it is seen that substantial suppression of the increase of loss is attained.

While the aperture dimension of the output transducers were selected to present equal static capacitances in the illustrated embodiment, the reduction of loss may also be attained by presenting equal static capacitances for the input transducers, or by presenting equal static capacitances for the input transducers and the output electrodes. The present invention is equally applicable to a surface acoustic wave device having three or more sets of input and output transducers arranged on a piezoelectric substrate.

Figure 5:
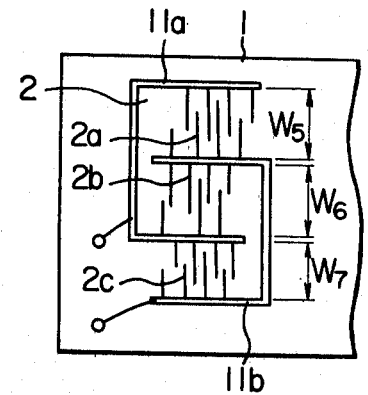
FIG. 5 shows a fragmentary plan view of another embodiment of the surface acoustic wave device of the present invention.

FIG. 5 shows a fragmentary plan view of another embodiment in which three interdigital transducers 2a, 2b and 2c serving as the input transducer 2 are connected electrically in parallel by common bus bars 11a and 11b.

By applying the teaching of the present invention, a condition for minimum loss for any two (one pair) of the three interdigital transducers 2a, 2b and 2c, for example, for the interdigital transducers 2a and 2b, is given by determining the aperture dimensions $W_5$ and $W_6$ of that pair such that the static capacitances $C_{2a}$ and $C_{2b}$ of that pair are equal to each other, and determining the aperture dimensions $W_6$ and $W_7$ of other pair of interdigital electrodes such that the capacitances $C_{2b}$ and $C_{2c}$ of the other pair are equal to each other.

As described hereinabove, according to the present invention, there is provided a surface acoustic wave device having plural sets of parallel-connected input and output transducers in which the aperture dimension of at least one of the input transducer and the output transducer is selected to present equal static capacitances in each of the sets. Accordingly, the loss due to the parallel connection is minimized without affecting the frequency characteristic.

We claim:

1. A surface acoustic wave device having interdigital input and output transducers arranged on a piezoelectric substrate, with at least said input transducers having a combination of a plurality of interdigital transducers electrically connected in parallel by common bus bars,
   wherein aperture dimensions of said interdigital transducers of said combination of said input transducer are selected such that any pair of said interdigital transducers of said input transducer presents a substantially equal static capacitance in each pair.

2. A surface acoustic wave device having interdigital input and output transducers arranged on a piezoelectric substrate, with at least said output transducers having a combination of a plurality of interdigital transducers electrically connected in parallel by common bus bars,
   wherein aperture dimensions of said interdigital transducers of said combination of said output transducer are selected such that any pair of said interdigital transducers of said output transducer presents a substantially equal static capacitance in each pair.

3. In a surface acoustic wave device including an acoustic wave propagating substrate, an input transducing system disposed on said substrate responsive to an input electrical signal applied thereto for launching an acoustic surface wave along said substrate, and an output transducing system disposed on said substrate responsive to said wave for developing an output electrical signal, said improvement comprising:
   at least one of the input or output transducing systems comprising a plurality of transducers connected in parallel, each transducer having a different frequency characteristic and the same static capacitance.

4. A surface acoustic wave device as defined in claim 3 in which:
   the aperture dimension of said each transducer is determined in accordance with its frequency characteristic.

* * * * *